(12) United States Patent
Verstappen et al.

(10) Patent No.: US 7,547,495 B2
(45) Date of Patent: Jun. 16, 2009

(54) DEVICE MANUFACTURING METHOD AND COMPUTER PROGRAM PRODUCT

(75) Inventors: Leonardus Henricus Marie Verstappen, Weert (NL); Everhardus Cornelis Mos, Best (NL)

(73) Assignee: ASML Netherlands B.V, Veldhoven (NL)

( * ) Notice: Subject to any disclaimer, the term of this patent is extended or adjusted under 35 U.S.C. 154(b) by 636 days.

(21) Appl. No.: 11/312,650

(22) Filed: Dec. 21, 2005

(65) Prior Publication Data

US 2007/0141486 A1  Jun. 21, 2007

(51) Int. Cl.
*G03C 5/00* (2006.01)
*G03F 9/00* (2006.01)

(52) U.S. Cl. .......................... 430/30; 430/312; 430/328
(58) Field of Classification Search .................. 430/22, 430/30, 312, 328
See application file for complete search history.

(56) References Cited

U.S. PATENT DOCUMENTS

| 5,308,741 | A | * | 5/1994 | Kemp .......................... 430/312 |
| 6,344,892 | B1 | * | 2/2002 | Sugita et al. .................. 355/53 |
| 6,366,341 | B1 | | 4/2002 | Shirato et al. |
| 6,451,508 | B1 | * | 9/2002 | Bukofsky et al. ........... 430/311 |
| 6,479,200 | B1 | | 11/2002 | Stirton |
| 6,589,713 | B1 | | 7/2003 | Okoroanyanwu |
| 6,625,512 | B1 | | 9/2003 | Goodwin |
| 2004/0078108 | A1 | | 4/2004 | Choo et al. |

OTHER PUBLICATIONS

European Search Report issued for European Patent Application No. 0625678.6—2222, dated Apr. 11, 2007.
Ebihara et al., "Beyond $K_1$=0.25 Lithography: 70nm L/S Patterning Using KrF Scanners," Proceedings of SPIE, vol. 5256, 2003, pp. 985-994.
Dusa et al., "Prospects and Initial Exploratory Results for Double Exposure/Double Pitch Technique," IEEE International Symposium on Semiconductor Manufacturing, San Jose, CA , USA, Sep. 13-15, 2005, pp. 177-180.

* cited by examiner

*Primary Examiner*—Christopher G Young
(74) *Attorney, Agent, or Firm*—Sterne, Kessler, Goldstein & Fox P.L.L.C.

(57) ABSTRACT

In a double exposure process to print features at a reduced pitch, the critical dimension of features printed in the first exposure is measured and used as a target for the second exposure.

14 Claims, 2 Drawing Sheets

DEVICE MANUFACTURING METHOD AND COMPUTER PROGRAM PRODUCT

FIELD OF THE INVENTION

The present invention relates to device manufacturing methods using lithographic apparatus, and to computer program products.

BACKGROUND OF THE INVENTION

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to increase the density of devices on an integrated circuit, it is necessary to reduce the size and pitch of lines and other features. However, most lithography apparatus operate at or near their resolution limits. Various process techniques have been developed to enable features smaller than the minimum size imageable by a lithography apparatus to be created. For example, to etch lines narrower than the width of a line in resist, the exposed resist can be treated with an electron beam, causing the remaining resist to liquefy or plasticize and flow to partially close the exposed lines. Then, lines can be etched into the underlying substrate that are narrower than the lines printed in the resist. To expose lines at a pitch smaller than the minimum pitch imageable by the lithographic apparatus, double exposure techniques can be used—a first set of lines is imaged at double the desired pitch, then a second set again at double the desired pitch but with a positional offset equal to the desired pitch. U.S. Pat. No. 6,589,713 discloses a method using both of these techniques to print features of reduced width and pitch. These techniques are particularly useful for gate definition but may also be used on other feature types.

A problem that can occur with double exposure techniques is that the widths of the features printed in the two exposure steps differ. This is illustrated in FIG. 2 of the accompanying drawings which shows features A which have been imaged in a first step at a pitch of 2P and features B which have been imaged in a second step, again at a pitch of 2P but with a positional offset of P. The resulting pattern has a pitch of P. The A features have a width (critical dimension—CD) of W1 and the B features a width of W2. Due to imaging or process variations, for example focus and dose variations, W1 may not equal W2. Such variation in CD can prevent the devices so made from functioning correctly, reducing yield of the process.

SUMMARY OF THE INVENTION

It is therefore desirable to provide an improved method for manufacture of devices by double exposure.

According to an aspect of the invention, there is provided a device manufacturing method using a lithographic apparatus, the method including printing a first set of features onto a target portion of a substrate, measuring a critical dimension of the first set of features, calculating settings for a printing process to print a second set of features on the target portion with a critical dimension matching the measured critical dimension of the first set of features, and printing the second set of features using the calculated settings interleaved with the first set of features.

According to an aspect of the invention, there is provided a device manufacturing method using a lithographic projection apparatus, including projecting an image of a first set of features onto a radiation-sensitive layer of a substrate to form a latent image, developing the latent image to reveal the first set of features as a real image, measuring the critical dimension of at least one feature of the real image, calculating a set of imaging parameters to image a second set of features with a target critical dimension matching the measured critical dimension, and projecting an image of the second set of features onto the radiation sensitive layer of the substrate using the calculated settings and so that the second set of features are at least partially interleaved with the second set of features to form an array of features having a pitch smaller than the pitch of both the first and second sets of features.

According to an aspect of the invention, there is provided a computer program product comprising program code to control a lithographic cluster including a lithographic apparatus and a measuring device arranged to measure the critical dimension of a feature printed on a substrate, to perform a device manufacturing method including printing a first set of features onto a target portion of a substrate, measuring a critical dimension of the first set of features, calculating settings for a printing process to print a second set of features on the target portion with a critical dimension matching the measured critical dimension of the first set of features, and printing the second set of features using the calculated settings interleaved with the first set of features.

According to an aspect of the invention, there is provided a computer program product comprising program code to control a lithographic cluster including a lithographic apparatus and a measuring device arranged to measure the critical dimension of a feature printed on a substrate, to perform a device manufacturing method including projecting an image of a first set of features onto a radiation-sensitive layer of a substrate to form a latent image, developing the latent image to reveal the first set of features as a real image, measuring the critical dimension of at least one feature of the real image, calculating a set of imaging parameters to image a second set of features with a target critical dimension matching the measured critical dimension, and projecting an image of the second set of features onto the radiation sensitive layer of the substrate using the calculated settings and so that the second set of features are at least partially interleaved with the second set of features to form an array of features having a pitch smaller than the pitch of both the first and second sets of features.

According to an aspect of the invention, in a device manufacturing method using a double exposure process to print an array of features at a reduced pitch, the improvement including measuring the critical dimension of features printed in a first exposure of the double exposure and performing the second exposure of the double exposure at settings to provide a target critical dimension matching the measured critical dimension.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
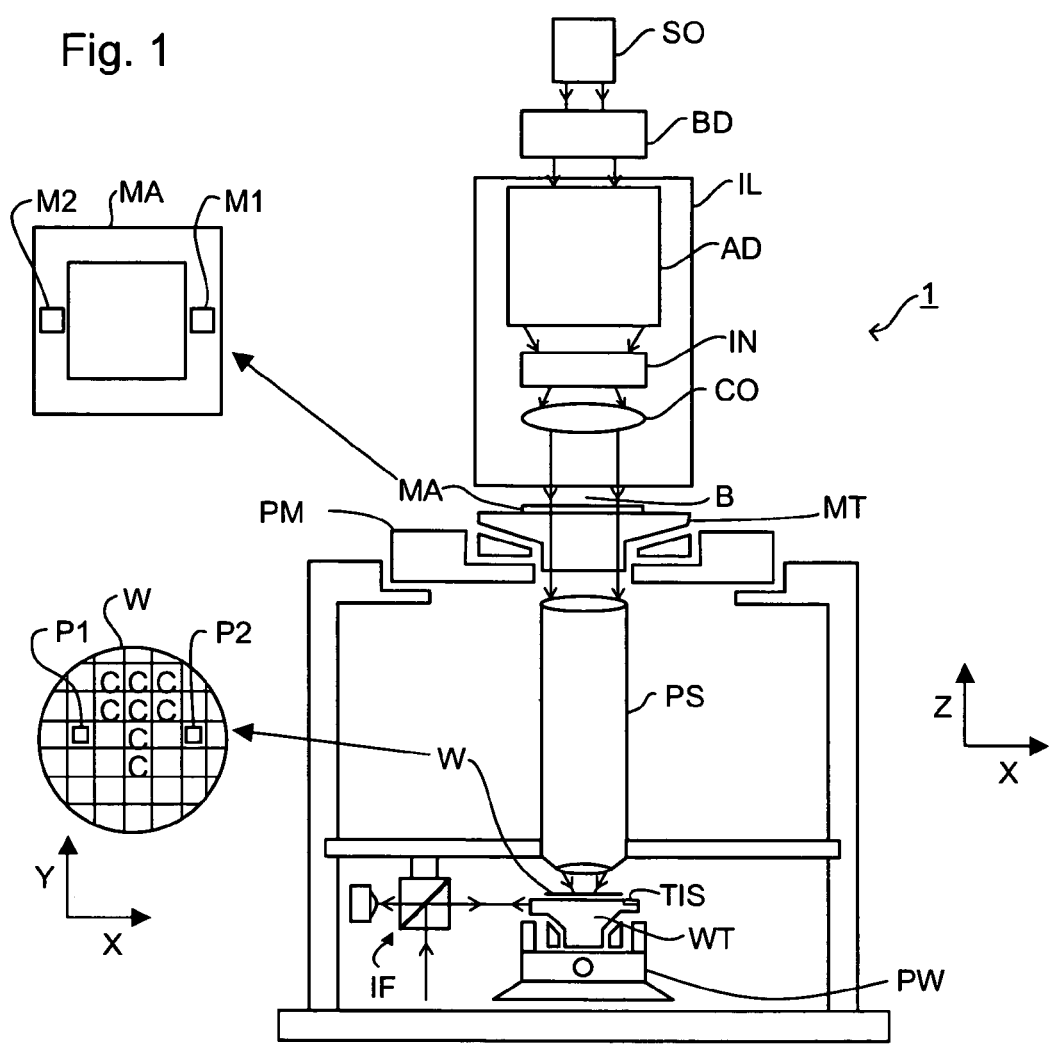
FIG. 1 depicts a lithographic apparatus usable in embodiments of the invention.
Figure 2:
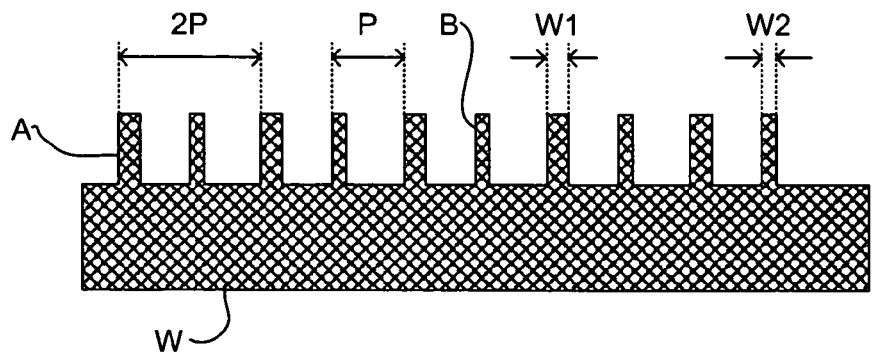
FIG. 2 depicts features made by double exposure.

FIG. 1 schematically depicts a lithographic apparatus that can be used in one embodiment of the invention. The apparatus comprises:

- an illumination system (illuminator) IL configured to condition a radiation beam B (e.g. UV radiation or DUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate.

It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment markers M1, M2 and substrate alignment markers P1, P2. Although the substrate alignment markers as illustrated occupy dedicated target portions, they may be located in spaces between target portions (these are known as scribe-lane alignment markers). Similarly, in situations in which more than one die is provided on the mask MA, the mask alignment markers may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 3:
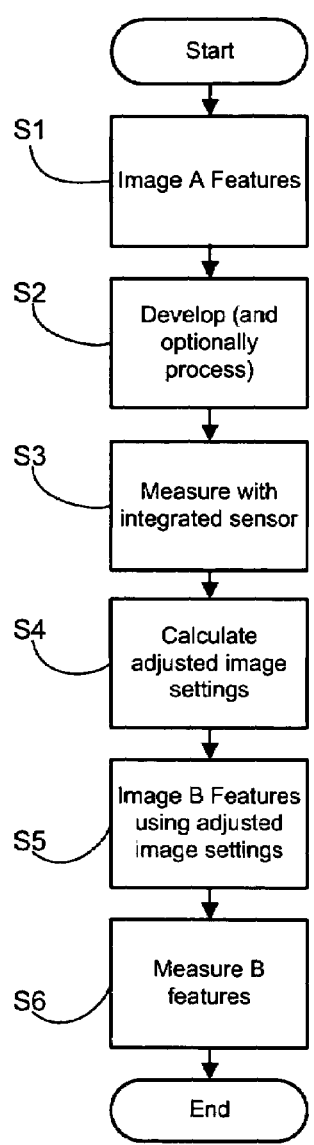
FIG. 3 depicts a method according to an embodiment of the invention.

A method according to the invention is depicted in FIG. 3. In this method, a double exposure technique is used to print features of a device at a reduced feature width and/or pitch compared to the normal limit of the device. The process comprises printing a first set of features and then printing a second set of features interleaved with the first set so as to form a combined set of features having a pitch smaller than the pitch of either the first or second sets of features. The second set of features is generally different from the first set of features but in some cases the same pattern may be used for the second exposure, but with a positional offset. Further details of this technique, and techniques to reduce feature widths, are known to the person skilled in the art and a description thereof will be omitted for the sake of brevity.

In the embodiment, after the first exposure has been performed S1 to print an image of the first set of features in a radiation sensitive layer (e.g. a resist) and the resist developed S2 to reveal the latent image as a real image, the critical dimension of at least one feature in the first set of features is measured S3. In one example, the feature measured is one whose relevant dimension is to be matched to one or more features in the second set of features for proper or improved functioning of the device to be made.

Figure 4:
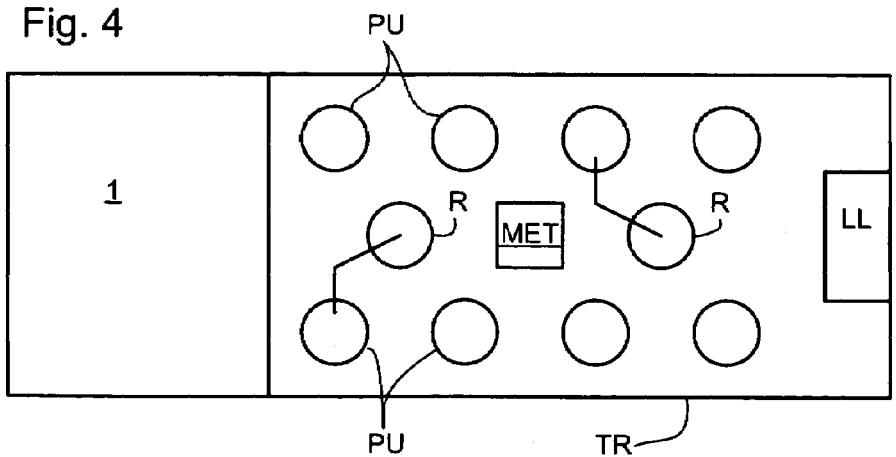
FIG. 4 depicts a lithocluster usable in an embodiment of the invention.

The critical dimension may be measured with any suitable device, for example a scatterometer, a scanning electron microscope or a dual beam device. It is useful if the device used to measure the critical dimension is integrated into the lithocluster with the lithographic apparatus. To do this, a scatterometer is useful. Such an arrangement is shown in FIG. 4, which depicts a lithocluster comprising a lithographic apparatus 1 and a process section, or track TR. This comprises a number of process units PU, e.g. spin coaters, bake and chill plates, developers, etc., some of which may be multipurpose. Robots R transport substrates to and from a load lock LL, among the process units and to and from the lithographic apparatus 1. In an embodiment of the invention, the substrates may also be transported to an integrated scatterometer or other metrology device MET to measure the critical dimension. An integrated control system, not shown, controls the various devices and communicates the necessary data to the lithographic apparatus. A standalone device can also be used to measure the CD of the first imaged features.

Based on the measured critical dimension, in an embodiment of the invention, settings for the second exposure are calculated S4 with the aim of matching the critical dimension of the second set of features to that of the first set. Various parameters of an exposure step affect the critical dimension of the imaged features and may be adjusted to give the desired critical dimension. A convenient parameter is the exposure dose, which may be controlled by adjusting the source output or the exposure time, in step mode, or the scan speed, in scan mode. Depending on whether a positive or negative resist is used, increasing the exposure dose increases or decreases the critical dimension, as is well known. Settings for focus, astigmatism (horizontal and vertical focus difference), mask height and substrate height can be used to control CD.

The second set of features is then imaged S5 using the calculated settings so as to produce features with a critical dimension matching that of the first set of features. In step S6, measurements can optionally be taken to verify that the applied corrections have provided the desired result. Thereafter, the process can be completed in the conventional manner.

It will be seen that the target CD for the second exposure is set dependent on the measured CD of the features imaged in the first exposure and may thus differ from the originally determined target CD and the target CD for the first set of exposures. In some cases, the target CD for the second exposure may differ from target portion to target portion, reflecting differences in the measured CD of the first exposures. By more accurately matching the CD between the first and second exposures of a double exposure process, the yield can be increased and in some cases faster operating devices can be made.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A device manufacturing method using a lithographic apparatus, the method comprising:
   printing a first set of features onto a target portion of a substrate;
   measuring a critical dimension of the first set of features;
   calculating settings for a printing process to print a second set of features on the target portion with the measured critical dimension; and
   printing the second set of features interleaved with the first set of features, using the calculated settings.

2. A method according to claim 1 wherein the first and second sets of features comprise lines.

3. A method according to claim 1 wherein the first and second sets of features define gates of an integrated circuit.

4. A method according to claim 1 wherein the measuring comprising using a scatterometer to measure the critical dimension of the first set of features.

5. A method according to claim 4 wherein the scatterometer is integrated into a lithocluster including the lithographic apparatus.

6. A method according to claim 1 wherein printing the first set of features comprises exposing a radiation-sensitive layer of the substrate to a pattern representing the first set of features and developing the radiation-sensitive layer.

7. A method according to claim 1 wherein printing the second set of features comprises exposing a radiation-sensitive layer of the substrate to a pattern representing the second set of features and developing the radiation-sensitive layer.

8. A method according to claim 1 wherein the settings comprise an exposure dose.

9. A method according to claim 1 wherein the first set of features are different than the second set of features.

10. A method according to claim 1 wherein the second set of features is the same as the first set of features but is positionally off-set from the first set of features.

11. A device manufacturing method using a lithographic projection apparatus, the method comprising:
    projecting an image of a first set of features onto a radiation-sensitive layer of a substrate to form a latent image;
    developing the latent image to reveal the first set of features as a real image;
    measuring the critical dimension of at least one feature of the real image;
    calculating a set of imaging parameters to image a second set of features with a target critical dimension matching the measured critical dimension; and
    projecting an image of the second set of features onto the radiation sensitive layer of the substrate using the calculated set of imaging parameters so that the second set of features are at least partially interleaved with the first set of features to form an array of features having a pitch smaller than the pitch of both the first and second sets of features.

12. A computer program product comprising program code to control a lithographic cluster including a lithographic apparatus and a measuring device arranged to measure the critical dimension of a feature printed on a substrate, to perform a device manufacturing method comprising:
    printing a first set of features onto a target portion of the substrate;
    measuring a critical dimension of the first set of features;

calculating settings for a printing process to print a second set of features on the target portion with the measured critical dimension; and printing the second set of features interleaved with the first set of features, using the calculated settings.

13. A computer program product comprising program code to control a lithographic cluster including a lithographic apparatus and a measuring device arranged to measure the critical dimension of a feature printed on a substrate, to perform a device manufacturing method comprising:

projecting an image of a first set of features onto a radiation-sensitive layer of a substrate to form a latent image;

developing the latent image to reveal the first set of features as a real image;

measuring the critical dimension of at least one feature of the real image;

calculating a set of imaging parameters to image a second set of features with a target critical dimension matching the measured critical dimension; and projecting an image of the second set of features onto the radiation sensitive layer of the substrate using the calculated set of imaging parameters so that the second set of features are at least partially interleaved with the first set of features to form an array of features having a pitch smaller than the pitch of both the first and second sets of features.

14. In a device manufacturing method using a double exposure process to print an array of features at a reduced pitch, the improvement comprising measuring the critical dimension of features printed in a first exposure of the double exposure and performing the second exposure of the double exposure at settings to provide a target critical dimension matching the measured critical dimension.

* * * * *